United States Patent [19]
Chalmers et al.

[11] Patent Number: 5,397,739
[45] Date of Patent: Mar. 14, 1995

[54] METHOD FOR ACCURATE GROWTH OF VERTICAL-CAVITY SURFACE-EMITTING LASERS

[75] Inventors: Scott A. Chalmers; Kevin P. Killeen; Kevin L. Lear, all of Albuquerque, N. Mex.

[73] Assignee: Sandia Corporation, Albuquerque, N. Mex.

[21] Appl. No.: 99,035

[22] Filed: Jul. 26, 1993

[51] Int. Cl.$^6$ ............................................. H01L 21/20
[52] U.S. Cl. ...................................... 437/129; 437/7; 117/86
[58] Field of Search ..................... 437/129, 7; 156/601; 117/86

[56] References Cited

U.S. PATENT DOCUMENTS 5,256,596 10/1993 Ackley et al. ........................ 437/129
5,258,316 11/1993 Ackley et al. ........................ 437/129

OTHER PUBLICATIONS

S. A. Chalmers et al. "Method for Accurate Growth of Vertical-Cavity Surface-Emitting Lasers," Appl. Phys. Lett. 62(11), 15 Mar. 1993, pp. 1182–1184.

K. Bacher, et al. "Molecular Beam Epitaxy Growth of Vertical Cavity Optical Devices with in situ Corrections," Appl. Phys. Lett 61(12) 21 Sep. 1992 pp. 1387–1389.

C. Lavoie et al. "Diffuse Optical Reflectivity Measurements on GaAs During Molecular Beam Epitaxy Processing," J. Vac. Sci. Technol. A 10(4), Jul/Aug. 1992, pp. 930–933.

D. E. Aspnes et al. "Real–Time Optical Diagnostics for Epitaxial Growth," J. Vacuum Sci. Technol. A 9(3) May/Jun. 1991, pp. 870–875.

*Primary Examiner*—R. Bruce Breneman
*Assistant Examiner*—Linda J. Fleck
*Attorney, Agent, or Firm*—Gregory A. Cone

[57] ABSTRACT

We report a method for accurate growth of vertical-cavity surface-emitting lasers (VCSELs). The method uses a single reflectivity spectrum measurement to determine the structure of the partially completed VCSEL at a critical point of growth. This information, along with the extracted growth rates, allows imprecisions in growth parameters to be compensated for during growth of the remaining structure, which can then be completed with very accurate critical dimensions. Using this method, we can now routinely grow lasing VCSELs with Fabry-Perot cavity resonance wavelengths controlled to within 0.5%.

19 Claims, 4 Drawing Sheets

METHOD FOR ACCURATE GROWTH OF VERTICAL-CAVITY SURFACE-EMITTING LASERS

BACKGROUND OF THE INVENTION

The government has rights in this invention pursuant to Contract No. DE-AC04-76DP00789 awarded by the U.S. Department of Energy.

This invention relates to methods for producing vertical-cavity surface-emitting lasers. More particularly this relates to growth techniques for such solid state lasers that can achieve Fabry-Perot cavity resonance wavelengths within 1% accuracy.

Vertical-cavity surface-emitting lasers (VCSELs) offer many potential advantages over conventional in-plane lasers and are the subject of much current interest. However, growth of VCSEL structures is problematic and challenges the accuracy and reproducibility limits of modern epitaxial methods. Control of the Fabry-Perot cavity resonance wavelength, which must be held within approximately 1% of the gain spectrum peak to result in a device with reasonable operating characteristics is the most important and difficult challenge of VCSEL growth. The resonance wavelength depends on the Fabry-Perot cavity thickness, as well as the peak reflectivity (or center) wavelength of the top and bottom distributed Bragg reflection (DBR) mirrors, since the optical field extends well into the mirrors.

To produce VCSELs with the required approximately 1% structural accuracy, growers have conventionally relied on high-accuracy growth rate calibrations which are acquired just before growth. These calibrations are generally only accurate to about 1%, and are both time consuming and subject to drift. In molecular beam epitaxy (MBE), growth rate calibrations are further complicated by flux transients at shutter openings, and are rendered useless once an effusion cell temperature is changed, thereby reducing the number of device designs that can be accurately grown.

SUMMARY OF THE INVENTION

The VCSEL growth technique of this invention utilizes a single reflectivity spectrum measurement to relax the required growth rate calibration rigors, while at the same time improving control over the final resonance wavelength. Reflectivity spectra acquired ex situ are a common way of characterizing individual mirrors and completed VCSEL structures. The reflectivity spectrum of a mirror reveals its center wavelength, while the spectrum of a VCSEL gives its cavity resonance wavelength (mirror information is also present in the VCSEL spectrum, but it is usually convoluted and difficult to interpret). The technique disclosed herein uses a single reflectivity spectrum taken after the bottom mirror and approximately 94 to 100% of the cavity have been grown. The bottom mirror center wavelength and the resonance wavelength of this intermediate structure can be directly read from this spectrum, and from these the thickness of the cavity region can be derived, as well as relevant growth rate information. Therefore, this one measurement yields all the information needed for the completion of the VCSEL of the desired cavity resonance wavelength.

In principle, this information can lead to a device with extremely accurate critical dimensions. If, for example, one could measure the unfinished cavity thickness precisely, the accuracy of the completed cavity will be determined by how accurately the remaining few percent (~10 nm) of the cavity can be grown. One should then be able to grow this to within about 0.1 nm, which would lead to a final cavity thickness uncertainty of less than 0.05% for a device with a single-wavelength-thick cavity.

In addition to the cavity thickness, the dimensions of the DBR mirrors also are critical because they shift the resonance wavelength away from the cavity wavelength towards their own center wavelengths. The amount a mirror shifts the resonance wavelength is determined by the difference between its center wavelength and the cavity wavelength. To compensate for any resonance wavelength shift caused by the bottom mirror, the top mirror can simply be grown so that its center wavelength is the same amount too long (short) as the bottom mirror is too short (long). In principle, this can also be done very accurately, since from the bottom mirror's center wavelength one can determine the growth rate of the mirrors to within better than 0.1%.

DETAILED DESCRIPTION OF THE INVENTION

Although there are several factors that reduce the accuracy of this technique somewhat, the following example of a 980 nm VCSEL illustrates that this method results in devices with resonance wavelengths that are within a fraction of the required 1% accuracy. The 980 nm VCSEL is designed with a three (Ga,In)As quantum well gain region, compositionally-graded (Al, Ga)As cladding layers, the cladding layers and the quantum well gain region comprising the optical cavity of the VCSEL, and piecewise-linearly-graded DBR mirrors. The bottom n-type mirror has 33.5 periods, while the top p-type mirror has 20.5 periods. The growth was performed in a Riber 32P MBE system with the sample in the "high uniformity" position. No growth rate calibrations were performed before the growth. Rather, the growth rates were estimated from calibration curves whose long-term accuracy have been found to be within a few percent.

The reflectivity measurement was taken under ultra-high vacuum conditions at room temperature in an analysis chamber that is auxiliary to the growth chamber. The measurement was taken through a pyrex viewport with illumination by a tungsten light source. Reflected light was passed through a 0.25 m spectrometer and detected by a Si photodiode array attached to a multichannel analyzer. The reflectivity spectra were normalized by the reflectivity spectrum of a reference GaAs substrate. Cooling the sample to room temperature took approximately 40 minutes with the sample facing a cryopanel. This, combined with the measurement, its interpretation, and preparations for the resumption of growth, took slightly over one hour. Although the sample was cooled to room temperature for this specific embodiment, the measurement could be taken at any temperature. In one preferred embodiment it would be taken at processing temperature to avoid the time delay involved with the cooling and reheating. Temperature corrections should be made as appropriate.

Figure 1:
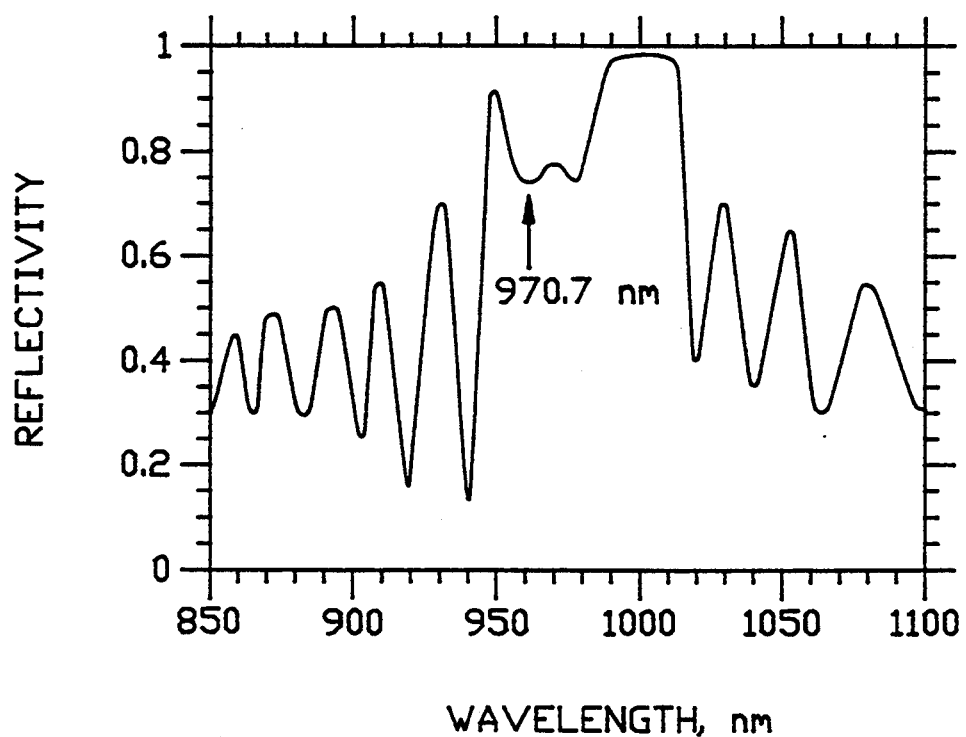
FIG. 1 is a graph showing reflectivity as a function of wavelength for an uncompleted VCSEL structure.

FIG. 1 shows the reflectivity spectrum of the sample after the bottom mirror and an estimated 97.5% of the cavity was grown. From the mirror reflectivity minima, the bottom mirror center wavelength is calculated to be 979.3 nm, which is 0.07% less than its designed value. The Fabry-Perot dip of this structure is read from the figure to be 970.7 nm. The actual resonance wavelength is slightly shorter than this because the reflectivity in this range is also affected by the wavelength-dependent absorption of the (Ga,In)As quantum wells, which are also responsible for the small dip at slightly longer wavelength. The spectrum illustrates why the intermediate cavity thickness needs to be about 94% or more of the final cavity thickness: if the intermediate cavity is much thinner, the resonance wavelength will not fall within the mirror stop band, thus making it difficult to measure accurately.

Figure 2:
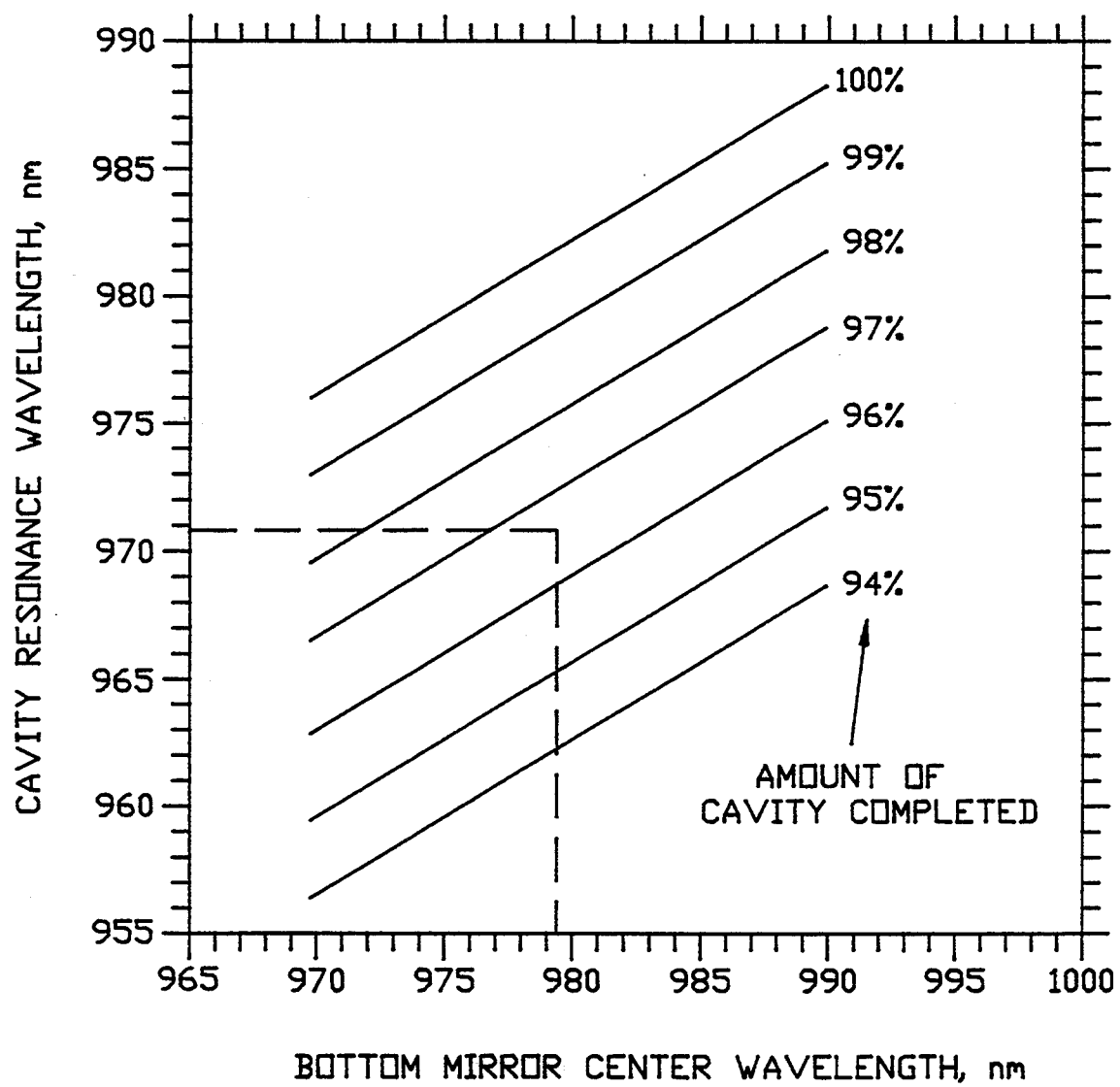
FIG. 2 is a plot used to determine the thickness of the intermediate Fabry-Perot cavity from the measured DBR mirror center wavelength and cavity resonance wavelength derived from transmission matrix simulations.

Accurate determination of the cavity thickness from the Fabry-Perot resonance and mirror center wavelengths is important for the accurate completion of the VCSEL. To accomplish this, we have used the known structural characteristics of the bottom mirror, and determined the cavity thickness by fitting the measured spectrum with the aid of transmission matrix simulations. In practice, the simulations are done before growth by generating a family of curves that allow quick extraction of the cavity thickness from the reflectivity spectrum. FIG. 2 shows the cavity thickness as a function of measured mirror center wavelength and Fabry-Perot dip as determined from simulations of the present structure. From this graph, we determined that the intermediate cavity of FIG. 1 was actually only 96.5% of the desired final cavity thickness, rather than the targeted 97.5%. Since our present model does not account for the wavelength-dependent absorption, this includes an error of approximately 0.1%. The transmission matrix simulation technique is discussed more fully below.

Figure 3:
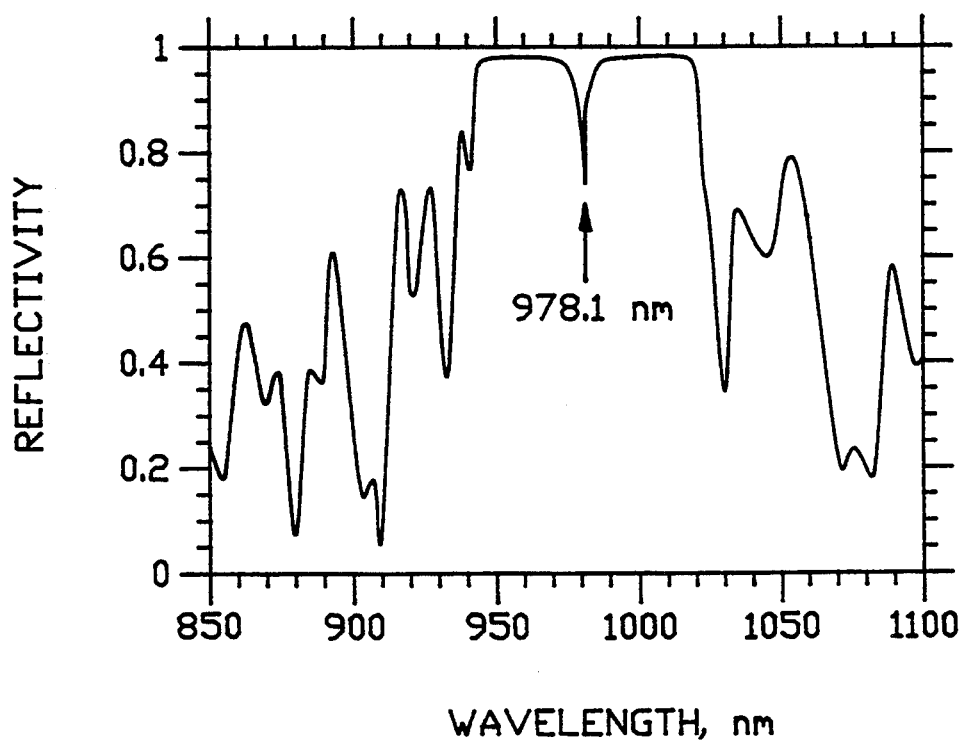
FIG. 3 is the reflectivity spectrum of a completed VCSEL.

After the sample was moved back into the growth chamber and brought to growth temperature, the final 3.5% of its cavity and then its top mirror were deposited. The top mirror was grown using the same parameters as the bottom mirror, since it was reasonably close to the desired 980 nm. The reflectivity spectrum of the completed device is shown in FIG. 3. The resonance wavelength of the device is 978.1 nm, which is 0.2% short of 980 nm, but well within the required 1% accuracy. Some of this error can be attributed to the 0.7 nm-short center wavelengths of the DBR mirrors, and to the errors incurred in the determination of the cavity thickness. Additional errors can be expected to originate from drift in the growth rates, and from flux transients that occur when shutters are first opened for the growth of the remainder of the cavity and then for the beginning of the top mirror. The total expected error from all of these sources is difficult to calculate; however, the results of over a half dozen growth runs suggest that a conservative estimate for the control of the cavity resonance wavelength is 0.5%.

In an alternative embodiment, the process can be streamlined by conducting the measurement within the growth chamber rather than removing it as is done in the specific embodiment discussed above. In this fashion the VCSEL does not need to be cooled down to room temperature for measurement but can, instead, be measured at the growth temperature within the growth chamber itself. As was mentioned above, corrections may be necessary to translate between the measurement at the elevated growth temperature and the actual operating wavelength at the operating temperature of the VCSEL. Simple modifications to the growth chamber would allow for the illumination of the VCSEL and capture of the light returning from the VCSEL for transmission to the interferometer and the photodetector.

In still another embodiment, the measurements can be made continuously during the growth process. When the measurements indicate that the precise thickness of the optical cavity has been reached, the growth of the materials at the top of the optical cavity is simply terminated, and the growth of the DBR layers in the top mirror is begun. As before, the measurement would also indicate whether the thickness of the top mirror DBR stack would need to be adjusted to compensate for deviations in the bottom mirror.

Besides accurate structural dimensions, any method for growing VCSELs must also produce devices with good optical and electrical characteristics. We have found no evidence of any detrimental effects of our reflectivity measurement cycle that includes interrupting growth, cooling and reheating the sample, and then resuming growth. In fact, all devices grown by this method have lased with excellent operating characteristics. This is not a totally unexpected result, since any deep levels formed at the interface of the interruption are not expected to have much effect embedded in the heavily p-type section of the cavity. These results, combined with the growth accuracy results, establish that this is a viable method for reliable production f VCSEL devices.

In summary, we have developed a method for growing VCSELs that routinely produces high-precision devices without the need for high-accuracy growth rate calibrations. A single reflectivity spectrum measurement serves to determine both bottom mirror and Fabry-Perot cavity thicknesses and growth rates at a critical point in VCSEL growth. This information allows us to control the final Fabry-Perot cavity resonance wavelength to within 0.5%.

Transmission Matrix Simulations

The following is a brief review of the 2×2 matrix calculation that is used to model the electric field intensity on resonance for VCSELs. Similar methods can be used to model the reflectance, reflectivity phase, transmittance, and absorptance of VCSEL and related structures such as DBRs. Computer programs that incorporate these methods have been developed serve as useful design tools. The computer programs allow for very general layered structures, defined by an input file, where the refractive index $N(\omega)=n(\omega)-i\kappa(\omega)$ is complex in each layer in order to adequately model absorption. Also, the angle of incidence (with s- or p-polarized fields) is arbitrary. In general, however, the field parameteres at normal incidence are of the most interest. The 2×2 matrix equations used to design multilayer optical interference coatings are well established and covered in varying detail in books such as *Principles of Optics*, 5th ed., M. Born and E. Wolf, Pergamon Press: New York, 1975; H. A. MacLeod, *Thin-Film Optical Coatings*, 2nd ed., McGraw-Hill: New York, 1989; P. Yeh, *Optical Waves in Layered Media*, Wiley: New York, 1988; and A. Thelen, *Design of Optical Interference Coatings*, McGraw-Hill: New York, 1989.

Two types of matrix approaches are commonly used, based on 2×2 "characteristic" or "transfer" matrices with complex number entries. Both methods rely on the following assumptions: nonmagnetic films, isotropic and homogeneous materials, smooth interfaces without scatter, plane parallel films of infinite extent, semi-infinite incident and substrate media, and linear wave equation.

The characteristic matrix approach relates the complex amplitude of the sum total of both the electric and magnetic field vectors (tangential components) at a given boundary (interface) to these same fields at the adjacent boundary. Each 2×2 matrix includes the parameters of the individual layers such as the refractive incex, thickness, and angle of incidence. In contrast, the transfer matrix approach uses 2×2 "dynamical" and "propogration" matrices to relate the incident (E+) and reflected (E−) electric field vectors to the same quantities at either side of a given interface or an adjacent interface. The matrices are multiplied together, in proper order, to find an overall transfer matrix for the multitude of layers. Both approaches have been computer coded and found to run at nearly identical speeds, with and without the use of Chebyshev polynomials to calculate the powers of the complex 2×2 matrices for blocks of repetitive layers. The transfer matrix approach can be implemented to calculate the electric field intensity (standing wave pattern) on resonance as described below.

Figure 4:
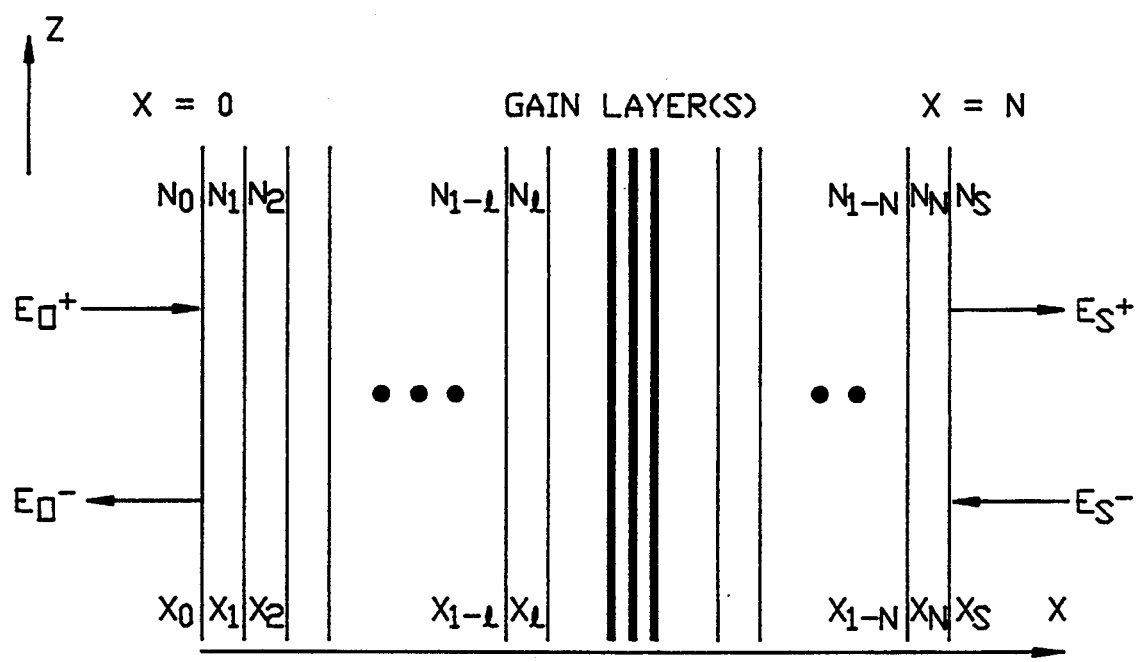
FIG. 4 is a diagram of a multilayer VCSEL structure presenting the nomenclature used in the transmission matrix simulation.

A general VCSEL structure for modeling purposes is shown in FIG. 4. The amplitudes of the incident ($E_o^+$) and reflected ($E_o^-$) electric field plane waves at $x=0$ are related to those at $x=N$ ($E_s^+$ and $E_s^-$) by $$\begin{pmatrix} E_o^+ \\ E_o^- \end{pmatrix} = \begin{pmatrix} M_{11} & M_{12} \\ M_{21} & M_{22} \end{pmatrix} \begin{pmatrix} E_s^+ \\ E_s^- \end{pmatrix} \quad (C.1)$$

where the transfer matrix M is $$\begin{pmatrix} M_{11} & M_{12} \\ M_{21} & M_{22} \end{pmatrix} = D_o^{-1} \left[ \prod_{l=1}^{N} D_l P_l D_l^{-1} \right] D_s \quad (C.2)$$

and $l = 0, 1, 2, \ldots, N_s$. At normal incidence, the dynamical matrices for arbitrary layer l are given by $$D_l = \begin{pmatrix} 1 & 1 \\ N_l & -N_l \end{pmatrix} \text{ and } D_l^{-1} = \tfrac{1}{2} \begin{pmatrix} 1 & 1/N_l \\ 1 & -1/N_l \end{pmatrix} \quad (C.3)$$

where N is the complex index of refraction for layer l. The propagation matrix for layer $P_l$ is given by $$P_l = \begin{pmatrix} e^{i\phi l} & 0 \\ 0 & e^{-i\phi l} \end{pmatrix} \quad (C.4)$$

where $$\phi_l = k_{lx} d_l \text{ and } k_{lx} = N_l \frac{\omega}{c_o} = N_l \frac{2\pi}{\lambda_o} \quad (C.5)$$

and where $d_l$ is the thickness of layer l and $k_{lx}$ is the x component of the wave vector. The complex electric field amplitude throughout the structure is given by $$E(x) = \begin{cases} E_o^+ e^{-ik_{ox}(x-x_o)} + E_o^- e^{ik_{ox}(x-x_o)} & x < x_o \\ E_l^+ e^{-ik_{lx}(x-x_l)} + E_l^- e^{ik_{lx}(x-x_l)} & x_{l-1} < x < x_l \\ E_s^+ e^{-ik_{sx}(x-x_N)} + E_s^- e^{ik_{sx}(x-x_n)} & x_n < x \end{cases} \quad (C.6)$$

From Eq. (C.1), the reflectivity coefficient (p) with $E_s^- = 0$ is given by $$\rho = \frac{M_{21}}{M_{11}} \quad (C.7)$$

The reflectivity for typical VCSEL structures is >0.999. To solve for the electric field intensity on resonance, the complex part of the refractive index ($\kappa$) for the quantum well layers(s) is phenomenologically made negative (providing uniform gain) to cause the reflectivity to reach exactly 1.0 over a range of wavelengths slightly above and below the Bragg design wavelength ($\lambda o$), so that $E_o^{30} = E_o^-$. The gain per well goes through a minimum as a function of $\lambda$, quickly found numerically, and this is taken as the resonance wavelength. Once $\rho = 1.0$ is found, the values of the complex electric field amplitudes a the interfaces are known and Eq (C.6) is used to calculate the electric field intensity throughout the entire VCSEL structure. The assumptions in the calculation are that the reflectance of the bottom DBR is 1.0, as seen from the optical cavity, and that the quantum well(s) provide uniform and equal gain. This calculation method is useful for modeling various constructions of the VCSEL such as designs with hybrid dielectric/semiconductor DBR mirror stacks. It is also useful for examining the overlap of the electric field intensity with the quantum well(s) in gain calculations, and for modeling the penetration of the standing wave into the DBR mirrors.

We claim:

1. A method of producing a vertical-cavity surface-emitting laser (VCSEL) structure having a bottom mirror means, a central optical cavity, and a top mirror means, in which the VCSEL is to have a design Fabry-Perot cavity resonance wavelength, the method comprising:

forming a first set of distributed Bragg reflector (DBR) layers to form the bottom mirror means, forming from about 94% to less than 100% of the central optical cavity, measuring the reflectivity spectra of the combined bottom mirror means and the partially formed central cavity, determining the correct thickness for the remaining portion of the central optical cavity from the measured reflectivity spectra that is necessary to achieve the design cavity resonance wavelength for the completed central optical cavity, and forming the remainder of the central optical cavity at the correct thickness and then forming a second set of distributed Bragg reflector (DBR) layers to form the top mirror means.

2. The method of claim 1 including the additional steps of determining the correct thickness of the top mirror means to compensate for inaccuracy in the thickness of the bottom mirror means as determined from the reflectivity spectra measurement and forming the top mirror means at the correct thickness.

3. The method of claim 1 wherein the measurement of the reflectivity spectra is accomplished by illuminating its upper surface with a light source, and passing the light returning from the VCSEL through a spectrometer onto a photodetector means, such steps being taken at about the temperature at which the optical cavity is formed.

4. The method of claim 1 wherein the measurement of the reflectivity spectra is accomplished by cooling the VCSEL to its approximate operating temperature, illuminating its upper surface with a light source, and passing the light returning from the VCSEL through a spectrometer onto a photodetector means.

5. The method of claim 3 wherein the light source is a broad spectrum light source.

6. The method of claim 4 wherein the approximate operating temperature is room temperature.

7. The method of claim 1 wherein the determination of the correct thickness is made by use of transmission matrix simulations.

8. The method of claim 2 wherein the determination of the correct thickness of the top mirror means is made by use of transmission matrix simulations.

9. A method of producing a vertical-cavity surface-emitting laser (VCSEL) structure having a bottom mirror means, a central optical cavity, and a top mirror means, in which the VCSEL is to have a design Fabry-Perot cavity resonance wavelength, the method comprising:

forming a first set of distributed Bragg reflector (DBR) layers to form the bottom mirror means, forming from about 94% to less than 100% of the central optical cavity, measuring the reflectivity spectra of the combined bottom mirror means and the partially formed central cavity to determine the bottom mirror means center wavelength and the resonance wavelength of the partially formed central cavity, determining the correct thickness for the remaining portion of the central optical cavity that is necessary to achieve the design cavity resonance wavelength for the completed central optical cavity, determining the correct thickness of the top mirror means to compensate for inaccuracy in the thickness of the bottom mirror means, forming the remainder of the central optical cavity at the correct thickness, and then forming a second set of distributed Bragg reflector (DBR) layers to form the top mirror means at the correct thickness.

10. The method of claim 9 wherein the measurement of the reflectivity spectra is accomplished by illuminating its upper surface with a light source, and passing the light returning from the VCSEL through a spectrometer onto a photodetector means, such steps being taken at about the temperature at which the optical cavity is formed.

11. The method of claim 9 wherein the measurement of the reflectivity spectra is accomplished by cooling the VCSEL to its approximate operating temperature, illuminating its upper surface with a light source, and passing the light returning from the VCSEL through a spectrometer onto a photodetector means.

12. The method of claim 9 wherein the light source is a broad spectrum light source.

13. The method of claim 11 wherein the approximate operating temperature is room temperature.

14. The method of claim 9 wherein the determination of the correct thickness of the central optical cavity is made by use of transmission matrix simulations.

15. The method of claim 9 wherein the determination of the correct thickness of the top mirror means is made by use of transmission matrix simulations.

16. A method of producing a vertical-cavity surface-emitting laser (VCSEL) structure having a bottom mirror means, a central optical cavity, and a top mirror means, in which the VCSEL is to have a design Fabry-Perot cavity resonance wavelength, the method comprising:

forming a first set of distributed Bragg reflector (DBR) layers to form the bottom mirror means, growing the central optical cavity, while measuring the reflectivity spectra of the combined bottom mirror means and the central optical cavity to determine the resonance wavelength of the central optical cavity as growth proceeds;

stopping growth of the central optical cavity when said resonance wavelength is equal to, within an acceptable tolerance, the design Fabry-Perot cavity resonance wavelength; and forming a second set of distributed Bragg reflector (DBR) layers to form the top mirror means.

17. The method of claim 16 including the additional steps of determining the correct thickness of the top mirror means to compensate for inaccuracy in the thickness of the bottom mirror means and forming the top mirror means at the correct thickness.

18. The method of claim 16 wherein the determination of the thickness of the central optical cavity is made by use of transmission matrix simulations.

19. The method of claim 17 wherein the determination of the correct thickness of the top mirror means is made by use of transmission matrix simulations.

* * * * *